(12) United States Patent
Watsuda

(10) Patent No.: US 10,803,789 B1
(45) Date of Patent: Oct. 13, 2020

(54) LIGHT-EMITTING DEVICE

(71) Applicant: InnoLux Corporation, Miao-Li County (TW)

(72) Inventor: Hirofumi Watsuda, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 16/439,686

(22) Filed: Jun. 12, 2019

(51) Int. Cl.
| | | |
|---|---|---|
| G06F 1/00 | (2006.01) | |
| G09G 3/32 | (2016.01) | |
| H01L 27/12 | (2006.01) | |
| G09G 3/20 | (2006.01) | |
| G09G 3/3225 | (2016.01) | |

(52) U.S. Cl.
CPC .............. G09G 3/32 (2013.01); G09G 3/2003 (2013.01); G09G 3/3225 (2013.01); H01L 27/1255 (2013.01); *G09G 2300/0465* (2013.01); *G09G 2300/0804* (2013.01)

(58) Field of Classification Search
CPC ................... G09G 3/36; G09G 3/3225; G09G 2320/0233; G09G 3/20; G09G 5/10
See application file for complete search history.

(56) References Cited

U.S. PATENT DOCUMENTS

| | | |
|---|---|---|
| 2005/0231450 A1 | 10/2005 | Takai |
| 2005/0264497 A1 | 12/2005 | Shin |
| 2006/0145964 A1 | 7/2006 | Park |
| 2013/0069993 A1* | 3/2013 | Nishimori .............. G09G 3/003 345/690 |
| 2013/0100173 A1* | 4/2013 | Chaji .................. G09G 3/3275 345/690 |
| 2013/0208021 A1 | 8/2013 | Lee |

FOREIGN PATENT DOCUMENTS

| | | |
|---|---|---|
| EP | 1 679 687 A2 | 7/2006 |
| EP | 1 679 687 A3 | 3/2007 |

* cited by examiner

*Primary Examiner* — Michael A Faragalla
(74) *Attorney, Agent, or Firm* — Winston Hsu

(57) ABSTRACT

A light-emitting device is used to emit light in a frame. The frame is split into a first field and a second field. The light-emitting device includes a scan line extending in a row direction; a first data line and a second data line extending in a column direction; a first pixel circuit coupled to the scan line and the first data line; a second pixel circuit coupled to the scan line and the second data line; a first light-emitting diode (LED) and a second LED driven by the first pixel circuit; and a third LED and a fourth LED driven by the second pixel circuit. The first LED and the fourth LED are arranged in different rows and driven in the first field, and the second LED and the third LED are arranged in different rows and driven in the second field.

20 Claims, 10 Drawing Sheets

|  | Column-1 | Column-2 | Column-3 | Column-4 | Column-5 | Column-6 |
|---|---|---|---|---|---|---|
| Row-1 | A | A | A | A | A | A |
| Row-2 | B | B | B | B | B | B |
| Row-3 | A | A | A | A | A | A |
| Row-4 | B | B | B | B | B | B |
| Row-5 | A | A | A | A | A | A |
| Row-6 | B | B | B | B | B | B |
| Row-7 | A | A | A | A | A | A |
| Row-8 | B | B | B | B | B | B |

FIG. 2

|  | Column-1 | Column-2 | Column-3 | Column-4 | Column-5 | Column-6 |
|---|---|---|---|---|---|---|
| Row-1 | A | B | A | B | A | B |
| Row-2 | B | A | B | A | B | A |
| Row-3 | A | B | A | B | A | B |
| Row-4 | B | A | B | A | B | A |
| Row-5 | A | B | A | B | A | B |
| Row-6 | B | A | B | A | B | A |
| Row-7 | A | B | A | B | A | B |
| Row-8 | B | A | B | A | B | A |

FIG. 5

|  | Column-1 | Column-2 | Column-3 | Column-4 |
|---|---|---|---|---|
| Row-1 | A | B | A | B |
| Row-2 | B | A | B | A |
| Row-3 | A | B | A | B |
| Row-4 | B | A | B | A |

LIGHT-EMITTING DEVICE

BACKGROUND OF THE DISCLOSURE

1. Field of the Disclosure

The invention relates to display technology, and more specifically, to pixel interlacing driving methods in an active matrix light-emitting diode (LED) display.

2. Description of the Prior Art

A light emitting device such as a display includes a plurality of pixels. A plurality of pixel circuits in the plurality of pixels respectively determine whether to turn on the pixels in the light emitting device to form an image. In order to boost display resolution, it is necessary to reduce the area of the pixel circuits.

SUMMARY OF THE DISCLOSURE

In one aspect of the invention, a light-emitting device is disclosed. The light-emitting device comprises: a scan line extending in a row direction, a first data line and a second data line extending in a column direction, a first pixel circuit coupled to the scan line and the first data line, a second pixel circuit coupled to the scan line and the second data line, a first LED and a second LED driven by the first pixel circuit; and a third LED and a fourth LED driven by the second pixel circuit. The first LED and the fourth LED are arranged in different rows and driven in the first field of a frame, and the second LED and the third LED are arranged in different rows and driven in the second field of the same frame.

These and other objectives of the present disclosure will no doubt become obvious to those of ordinary skill in the art after reading the following detailed description of the embodiment that is illustrated in the various figures and drawings.

BRIEF DESCRIPTION OF THE DRAWINGS

FIG. 2 shows a display field arrangement adopted by the light-emitting device in FIG. 1.

FIG. 5 shows a display field arrangement adopted by the light-emitting device in FIG. 4.

FIG. 8 shows a display field arrangement adopted by the light-emitting device in FIG. 7.

DETAILED DESCRIPTION

Figure 1:
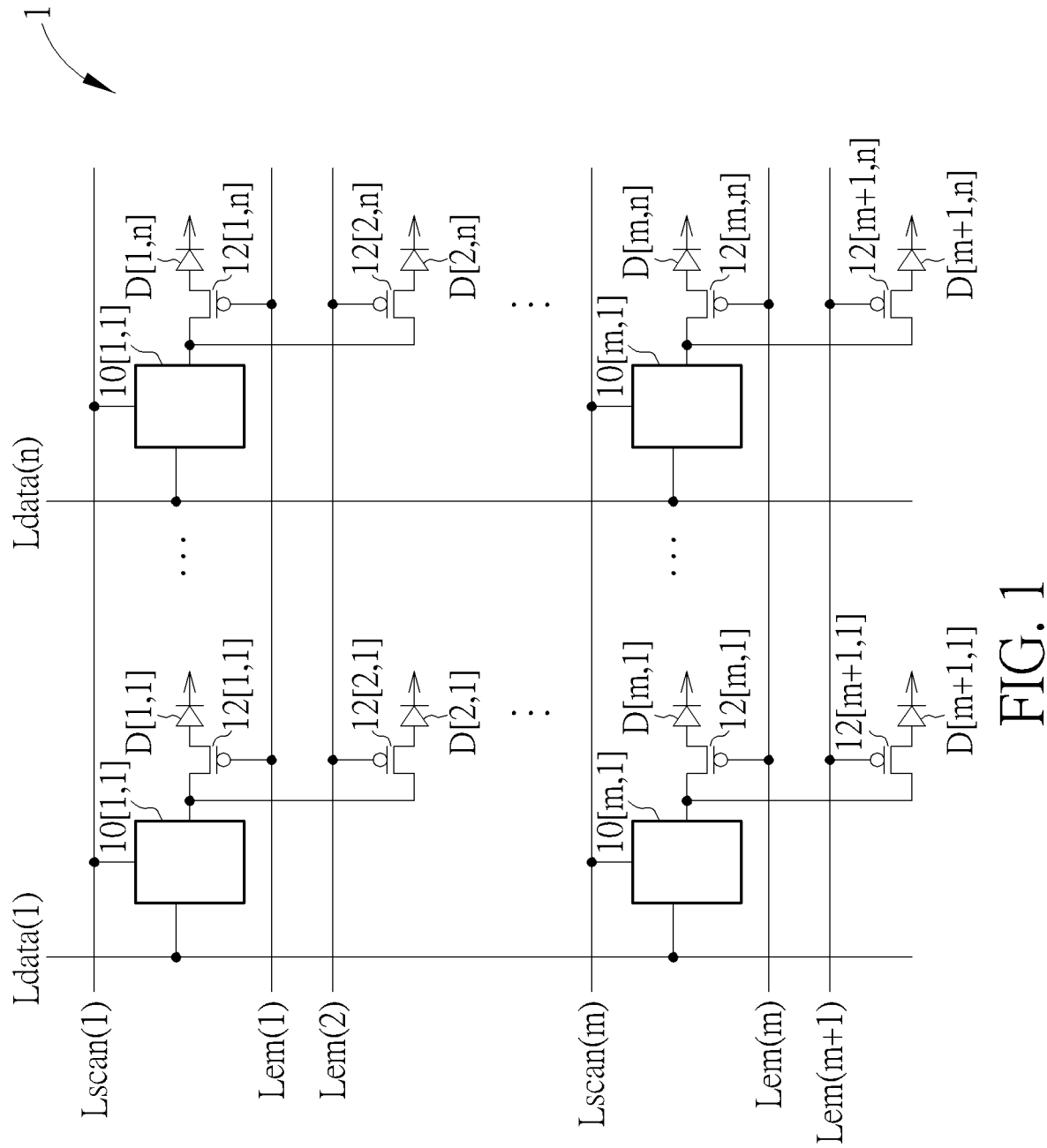
FIG. 1 is a schematic diagram of a light-emitting device according to an embodiment of the invention.

FIG. 1 is a schematic diagram of a light-emitting device 1 according to an embodiment of the invention. The light-emitting device 1 comprises a plurality of scan lines Lscan(m) extending substantially along a row direction and a plurality of data lines Ldata(n) extending substantially along a column direction, m is a row index ranging from 1 to M, n is a column index ranging from 1 to N, and the row direction and the column direction form an angle. In this embodiment, the row direction and the column direction are perpendicular to each other, but this disclosure is not limited thereto. The light-emitting device 1 further comprises a plurality of emission control lines Lem(m) extending substantially along the row direction, and a plurality of light-emitting diodes (LEDs) D[m,n] arranged in rows and columns, m is a row index ranging from 1 to M and n is a column index ranging from 1 to N. The light-emitting device 1 may adopt an interlacing driving method to double a perceived frame rate using the same bandwidth. In the interlacing driving method, an image frame is split into a first field and a second field. Correspondingly, the plurality of LEDs may be grouped in an interlaced manner, that is, LEDs may be grouped into 2 groups to display in the first field and the second field alternately. It should be noted that in this disclosure, the term "frame" or "image frame" is the time to show a still image in a light-emitting device, and the length of a frame depends on the refresh rate of the light-emitting device. For example, if the refresh rate is 60 HZ, the length of a frame is about 16.67 μsec. In the other hand, the term "field" means a part of a frame. In the disclosure, the sum of the length of the first field and the length of the second field equals to the length of a frame, in some embodiments of this disclosure, the first field and the second field have the same length, but this disclosure is not limited thereto. The light-emitting device 1 may further comprise a plurality of pixel circuits 10[m,n], wherein m may be an odd integer ranging from 1 to M and n is a column index ranging from 1 to N, and comprise a plurality of selecting switches 12[m,n], wherein m is a row index ranging from 1 to M and n is a column index ranging from 1 to N. A pixel circuit 10[m,n] may be coupled to a scan line Lscan(m) and a data line Ldata(n), and may be coupled to a pair of adjacent LEDs D[m,n] and D[m+1,n] from an odd-number row and an even-number row via a pair of selecting switches 12[m, n] and 12[m+1, n]. A selecting switch 12[m,n] comprises a control terminal coupled to an emission control line Lem (m). The pair of adjacent LEDs D[m,n] and D[m+1,n] may share the same pixel circuit 10[m,n] via the pair of selecting switches 12[m,n], 12[m+1,n] to receive pixel data of the first field and the second field respectively. For example, LEDs D[1,1] and D[2,1] share a pixel circuit 10[1,1] via the selecting switches 12[1,1] and 12[2,1] respectively. The selecting switches 12[m,n] may be transistors, and specifically, P-type transistors, in some embodiments, the selecting switches 12[m,n] may be N-type transistors. The LEDs D[m,n] may be organic light-emitting diodes (OLED), inorganic light-emitting diodes (LED), mini light-emitting diodes (Mini-LED), micro light-emitting diodes (μ-LED), quantum dot light-emitting diodes (QLED or QD-LED), or other self-emitting types of limit-emitting components. In some embodiments, a LED in the light-emitting device may emit monochromic light (e.g., blue LED), in some embodiments, a LED in the light-emitting device may emit lights of multiple colors (e.g., a LED to emit red, green, blue lights).

Since the LEDs acts as pixels in a light-emitting device, and two adjacent LEDs share a pixel circuit, the total area of the pixel circuits in the light-emitting device may be reduced.

The pixel circuit 10[m,n] may load pixel data from data line Ldata(n) and drive pixel data to a pair of adjacent LEDs D[m,n], D[m+1, n] via a pair of selecting switches 12[m,n], 12[m+1,n]. The pair of selecting switches 12[m,n], 12[m+1,n] may select one of the pair of adjacent LEDs D[m,n], D[(m+1),n] to receive pixel data at a time. For example, the pair of selecting switches 12[1,1] and 12[2,1] may select the LED D[1,1] in the first field, and then select the LED D[2,1] in the second field. As a result, an image may be displayed according to an interlaced display arrangement as depicted in FIG. 2, where A represents the image in the first field and B represents the image in the second field. In the first field, A may be displayed at odd-number rows from top to bottom, and then in the second field, B may be displayed at even-number rows from top to bottom. For example, LEDs D[m,n] in rows 1, 3, 5, 7 may display A in the first field, and then LEDs D[m,n] in rows 2, 4, 6, 8 may display B in the second field, resulting in that the A and the B are displayed alternately by the plurality of LEDs D[m,n].

Figure 3:
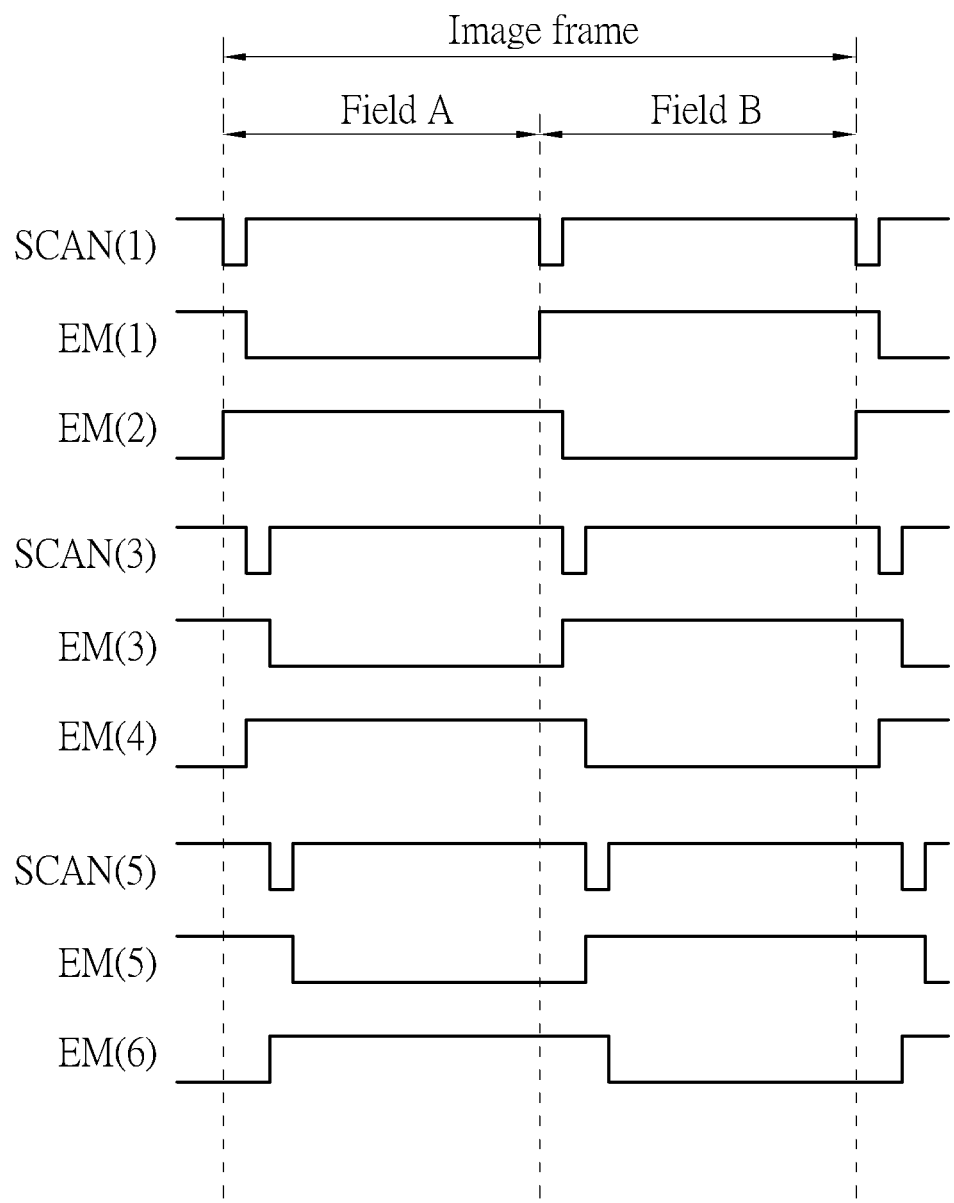
FIG. 3 is a timing diagram of selected signals in the light-emitting device in FIG. 1.

FIG. 3 is a timing diagram of selected signals in the light-emitting device 1, where SCAN(1), SCAN(3), SCAN(5) represent scan signals carried on scan lines Lscan(1), Lscan(3), Lscan(5), and EM(1) through EM(6) represent emission control signals carried on emission control lines Lem(1) through Lem(6). In the beginning of the first field, the scan signal SCAN (1) is pulled low for the pixel circuits 10[1,n] to scan pixel data, and then after the scan signal SCAN(1) is pulled high, the emission control signal EM(1) is pulled low to turn on the switches 12[1,n] for the LEDs D[1,n] to receive the pixel data from the pixel circuits 10[1,n], while the emission control signal EM(2) remains at a high voltage level to stop the LEDs D[2,n] from loading the pixel data from the pixel circuits 10[1,n]. In the beginning of the second field, the scan signal SCAN(1) is pulled low again for the pixel circuits 10[1,n] to scan pixel data, and then after the scan signal SCAN(1) is pulled high, the emission control signal EM(2) is pulled low to turn on the switches 12[2,n] for the LEDs D[2,n] to receive the pixel data from the pixel circuits 10[1,n], while the emission control signal EM(1) remains at the high voltage level to stop the LEDs D[1,n] from loading the pixel data from the pixel circuits 10[1,n]. The same process is repeated for rows 3 through 6, with each scanning and receiving pixel data process being sequentially later than the previous one. The emission control signals may have a duty cycle generated according to desired brightness of a corresponding LED D[m,n].

Figure 4:
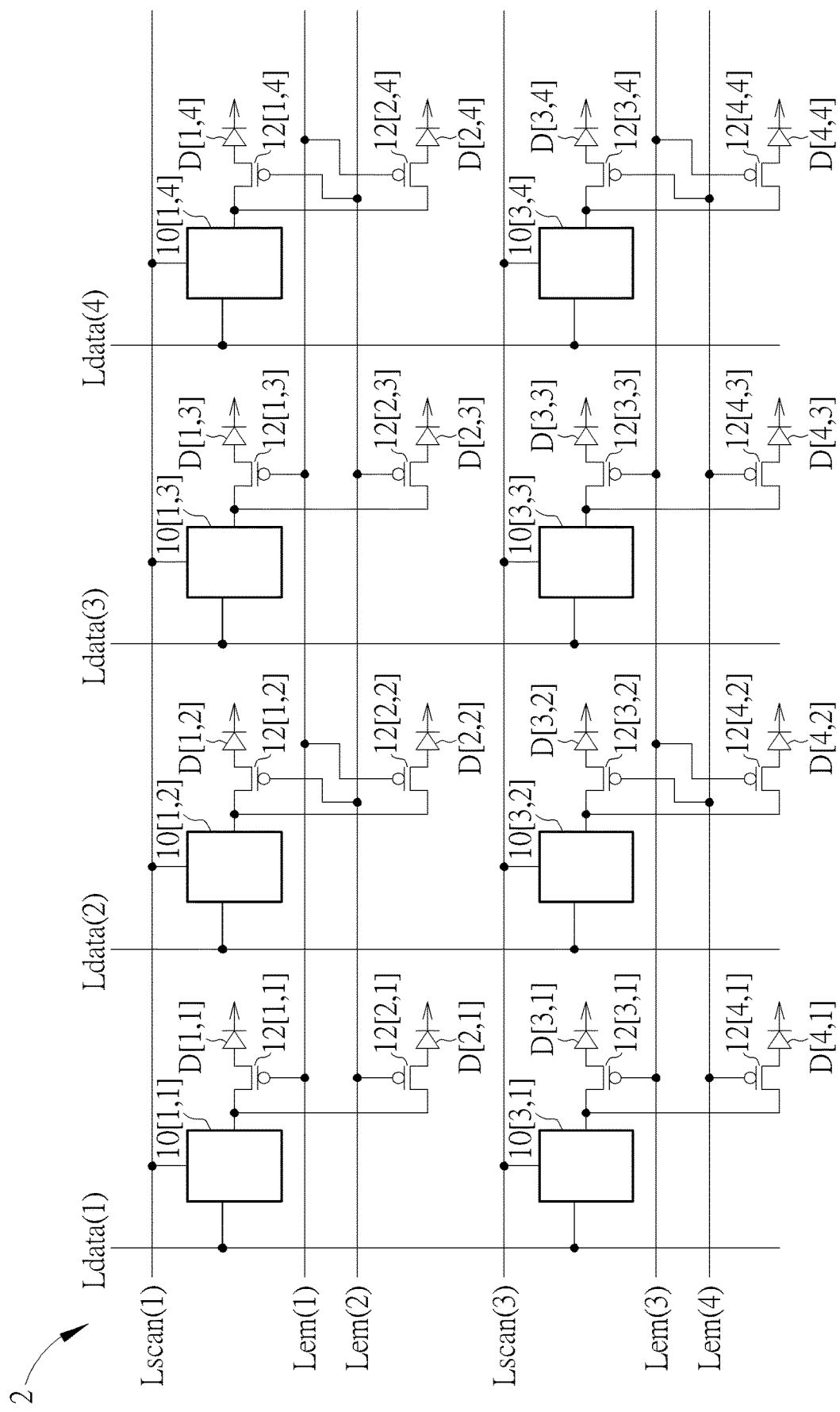
FIG. 4 is a schematic diagram of a light-emitting device according to another embodiment of the invention.

FIG. 4 is a schematic diagram of a light-emitting device 2 according to another embodiment of the invention. The light-emitting device 2 may emit light in a frame which is split into a first field and a second field. The light-emitting device 2 is similar to the light-emitting device 1, and the similar portion in this embodiment will not be repeatedly introduced. The main difference in this embodiment is that the interlacing orders of adjacent columns of the LEDs D(m,n) are different, and may be opposite to each other. For example, an interlacing order of a first column of the LEDs D(m,1) may start with the first field and then alternate between the second field and the first field until the last LED of the first column, and an interlacing order of a second column of the LEDs D(m,2) may start with the second field and then alternate between the first field and the second field until the last LED of the second column.

In the embodiment shown in FIG. 4, in the first field, the first LED D[1,1] and the fourth LED D[2,2] are driven by the first pixel circuit 10[1,1] and the second pixel circuit 10[1,2] respectively; In the second field, the second LED D[2,1] and the third LED D[1,2] are driven by the first pixel circuit 10[1,1] and the second pixel circuit 10[1,2] respectively.

The light-emitting device 2 further comprises a first emission control line Lem(1) to control the first switch 12[1,1] and the fourth switch 12[2,2], and a second emission control line Lem(2) to control the second switch 12[2,1] and the third switch 12[1,2]. In particular, the first emission control line Lem(1) carries a first emission control signal EM(1) to turn on the first switch 12[1,1] and the fourth switch 12[2,2] in the first field and turn off the first switch 12[1,1] and the fourth switch 12[2,2] in the second field, and the second emission control line Lem(2) carries a second emission control signal EM(2) to turn on the second switch 12[2,1] and the third switch 12[1,2] in the second field and turn off the second switch 12[2,1] and the third switch 12[1,2] in the first field. Besides controlling the interlacing order of the first LED D[1,1], second LED D[2,1], third LED D[1,2] and fourth LED D[2,2], the first emission control signal EM(1) and the second emission control signal EM(2) may be related to the brightness thereof.

FIG. 5 shows a display field arrangement adopted by the light-emitting device 2, where A represents the image in the first field and B represents the image in the second field. As illustrated in FIG. 5, adjacent columns of LEDs D[m, n], D[m, n+1] employs different interlacing orders. For example, for the first column, A may be displayed at odd-number lines from top to bottom in the first field, and then B may be displayed at even-number lines from top to bottom in the second field, and for the second column, A may be displayed at even-number lines from top to bottom in the first field, and then B may be displayed at odd-number lines from top to bottom in the second field, resulting in the alternate interlacing orders.

Figure 6:
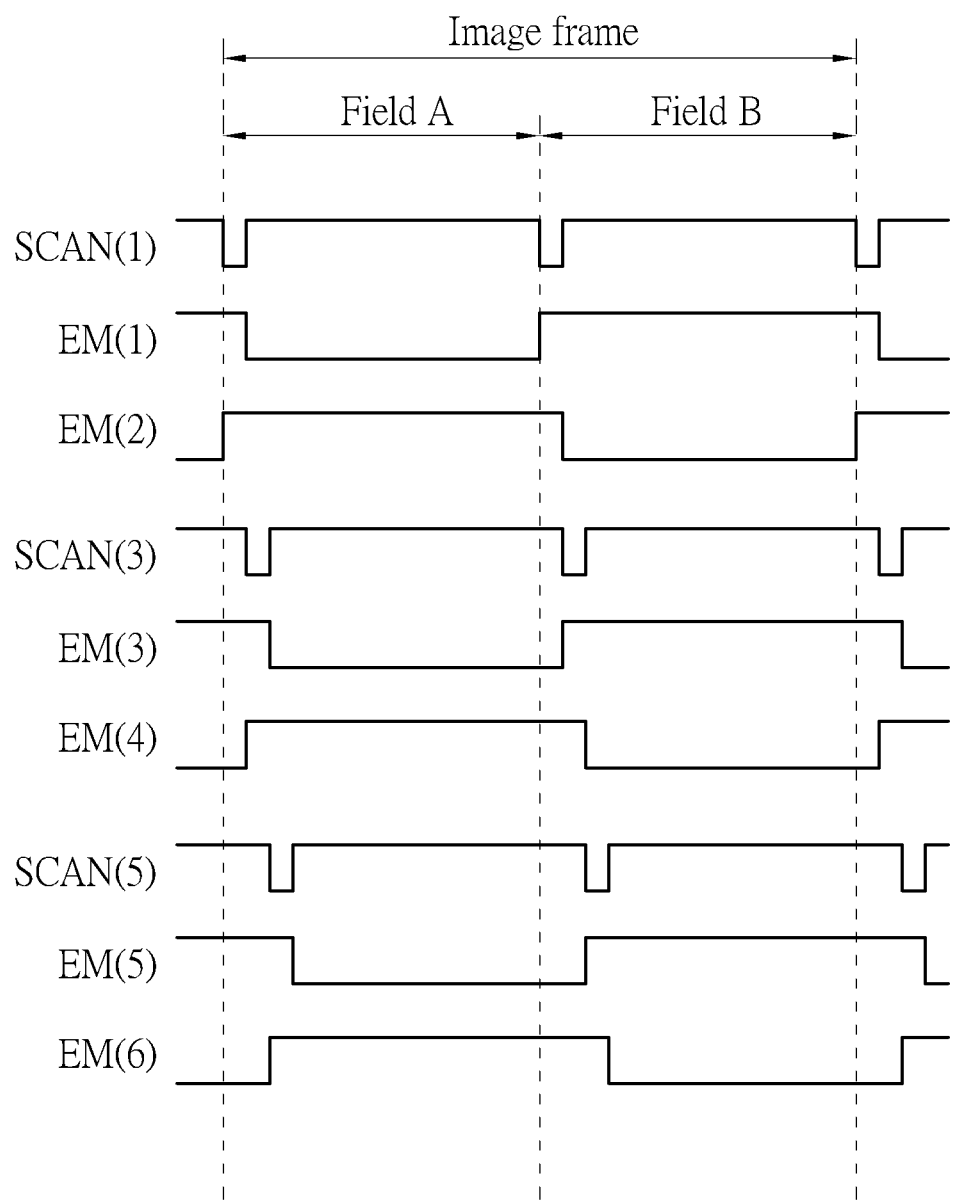
FIG. 6 is a timing diagram of selected signals in the light-emitting device in FIG. 4.

FIG. 6 is a timing diagram of selected signals in the light-emitting device 2, where SCAN(1), SCAN(3), SCAN(5) represent scan signals carried on scan lines Lscan(1), Lscan(3), Lscan(5), and EM(1) through EM(6) represent emission control signals carried on emission control lines Lem(1) through Lem(6). FIG. 6 is identical to FIG. 3, except that for odd columns, odd-number emission control signals may control LEDs D[m,n] in odd-number rows and even-number emission control signals may control LEDs D[m, n] in even-number rows. For even columns, even-number emission control signals may control LEDs D[m, n] in odd-number rows and odd-number emission control signals may control LEDs D[m,n] in even-number rows. For example, for the first column of the LEDs D[m,1], the odd-number emission control signals EM(1), EM(3), EM(5) may control LEDs D[1,1], D[3,1], D[5,1] in odd-number rows, respectively, and the even-number emission control signals EM(2), EM(4), EM(6) may control LEDs D[2,1], D[4,1], D[6,1] in even-number rows, respectively. For the second column of the LEDs D[m, 2], the odd-number emission control signals EM(1), EM(3), EM(5) may control LEDs D[2,2], D[4,2], D[6,2] in even-number rows, respectively, and the even-number emission control signals EM(2), EM(4), EM(6) may control LEDs D[1,2], D[3,2], D[5,2] in odd-number rows, respectively. As a consequence of the configuration, the light-emitting device 2 can implement the alternate interlacing patterns for adjacent columns of LEDs D[m,n] as shown in FIG. 5.

Figure 7:
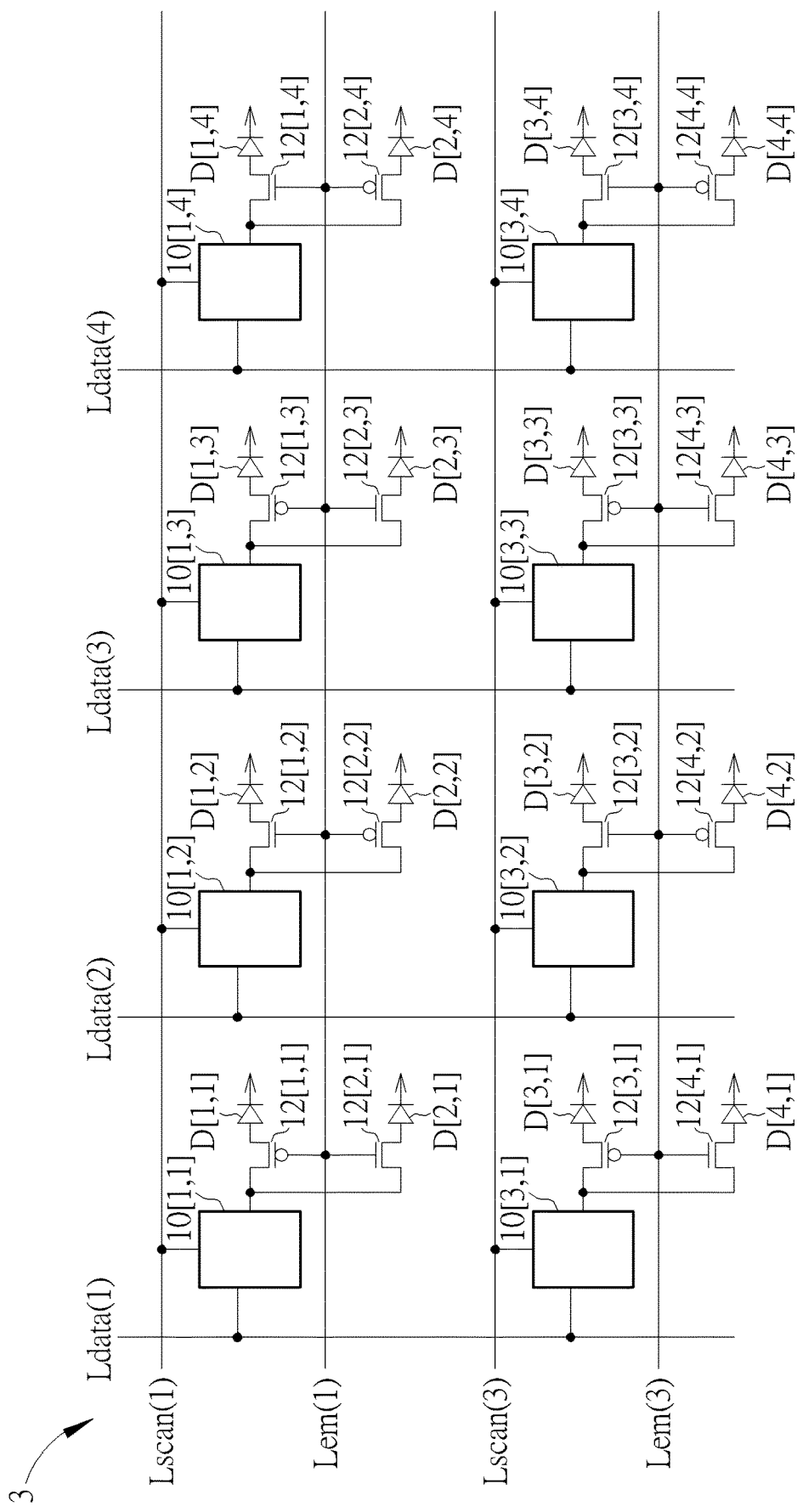
FIG. 7 is a schematic diagram of a light-emitting device according to yet another embodiment of the invention.

FIG. 7 is a schematic diagram of a light-emitting device 3 according to yet another embodiment of the invention. The configuration and operations of the light-emitting device 3 are similar to those of the light-emitting device 2, and the similar portion in this embodiment will not be repeatedly introduced. The main difference in this embodiment is that one emission control line Lem(1) is employed in the light-emitting device 3 in place of the two emission control lines Lem(1), Lem(2) in the light-emitting device 2, the emission control line Lem(1) is used to control the first switch 12[1,1], the second switch 12[2,1], the third switch 12[1,2] and the fourth switch 12[2,2] in the light-emitting device 3. Meanwhile the type of transistors used in the first switch 12[1,1] and the fourth switch 12[2,2] is different from the type of transistors used in the second switch 12[2,1] and the third switch 12[1,2]. In the embodiment shown in FIG. 7, N-type transistors are used to implement the second switch 12[2,1] and the third switch 12[1,2] in the light-emitting device 3, and P-type transistors are used to implement the first switch 12[1,1] and fourth switch 12[2,2], but this disclosure is not limited thereto. In some embodiments of the disclosure, the type of transistors used in the first switch 12[1,1] and the third switch 12[1,2] is different from the type of transistors used in the second switch 12[2,1] and the fourth switch 12[2,2].

In comparison to the light-emitting device 2, the light-emitting device 3 can achieve more reduction in circuit size, while delivering a substantially identical function. The light-emitting device 3 may produce alternate interlacing orders for adjacent columns of LEDs D[m,n], D[m,n+1] as depicted in FIG. 8. The duty cycle of emission control signals on the emission control line Lem(1) of light-emitting device 3 may be related to the brightness of the images in the first field and the second field.

It should be noted that the types of transistors in the first switch 12[1,1], the second switch 12[2,1], the third switch 12[1,2] and the fourth switch 12[2,2] may influence the interlacing orders. For example, in the embodiment shown in FIG. 7, the interlacing orders in FIG. 8 are identical to those in FIG. 5, and the explanations therefor will be omitted here for brevity. But when one type (e.g., P-type) of transistors are used in the first switch 12[1,1] and the third switch 12[1,2], and a different type (e.g., N-type) of transistors are used in the second switch 12[2,1] and the fourth switch 12[2,2], the interlacing orders may be similar to those in FIG. 2.

Figure 9:
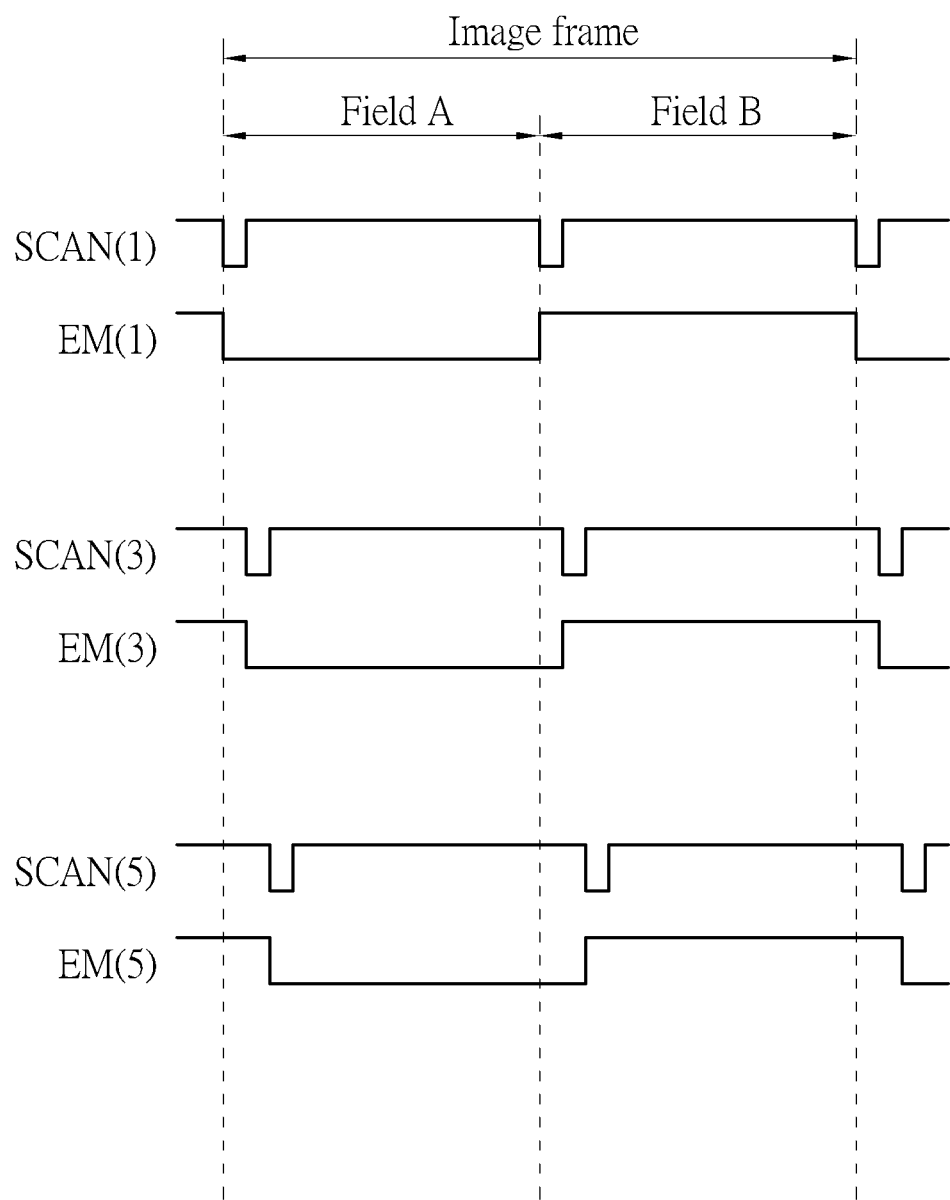
FIG. 9 is a timing diagram of selected signals in the light-emitting device in FIG. 7.

FIG. 9 is a timing diagram of selected signals in the light-emitting device 3 shown in FIG. 7, where SCAN(1), SCAN(3), SCAN(5) represent scan signals carried on scan lines Lscan(1), Lscan(3), Lscan(5), and EM(1), EM(3), EM(5) represent emission control signals carried on emission control lines Lem(1), Lem(3), Lem(5). The timings of the scan signals SCAN(1), SCAN(3), SCAN(5) in FIG. 9 are identical as in FIG. 6, explanations therefor will be omitted here for brevity. For odd columns of LEDs D [m, n], the emission control signals EM(1), EM(3), EM(5) may be pulled low to select LEDs D[1,n], LED D[3,n], LED D[5,n] to receive pixel data of the first field from the pixel circuits 10[1,n], 10[3,n], 10[5,n] respectively, and pulled high to select LEDs D[2,n], LED D[4,n], LED D[6,n] to receive pixel data of the second field from the pixel circuits 10[1, n], 10[3,n], 10[5,n] respectively. For even columns of LEDs D[m,n], the emission control signals EM(1), EM(3), EM(5) may be pulled low to select LEDs D[2,n], LED D[4,n], LED D[6,n] to receive pixel data of the first field from the pixel circuits 10[1,n], 10[3,n], 10[5,n], respectively, and pulled high to select LEDs D[1,n], LED D[3,n], LED D[5,n] to receive pixel data of the second field from the pixel circuits 10[1,n], 10[3,n], 10[5,n], respectively. The resultant interlacing patterns are shown in FIG. 8.

Figure 10:
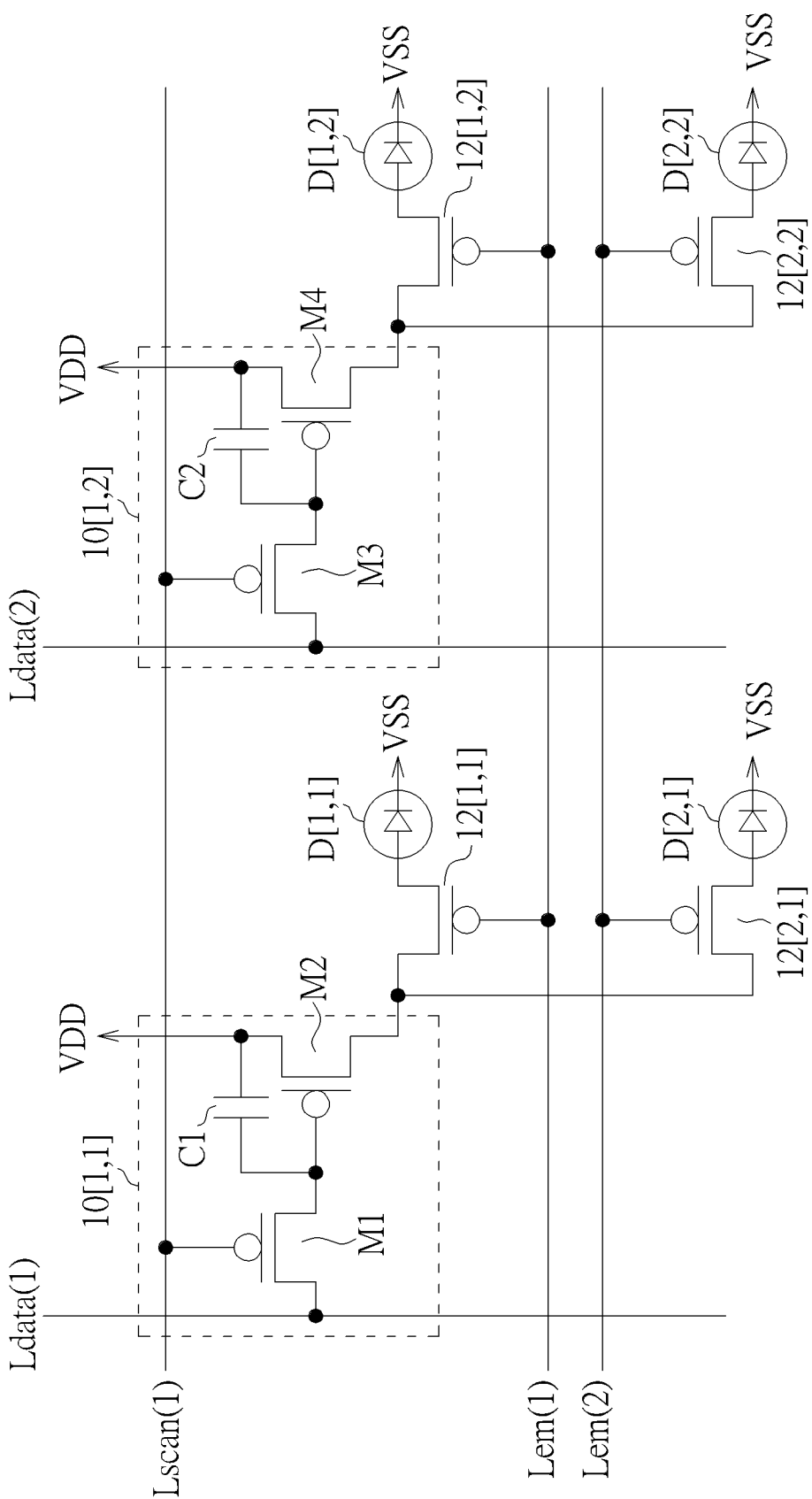
FIG. 10 is a schematic diagram of a pixel circuit in FIGS. 1, 4 and 7.

FIG. 10 is a schematic diagram of the first pixel circuit 10[1,1] and second pixel circuit 10[1,2] in FIG. 4. The first pixel circuit 10[1,1] comprises a first transistor M1, a second transistor M2 and a first capacitor C1. The first transistor M1 has a first terminal electrically connected to the first data line Ldata(1), a second terminal, and a control terminal electrically connected to the scan line Lscan(1). The second transistor M2 has a first terminal electrically connected to a supply voltage VDD, a second terminal electrically connected to the first LED D[1,1] and the second LED D[2,1] via the first switch 12[1,1] and the second switch 12[2,1] respectively, and a control terminal electrically connected to the second terminal of the first transistor M1. The first capacitor C1 is coupled to the first terminal of the second transistor M2 and the control terminal of the second transistor M2. Similarly, The second pixel circuit 10[1,2] comprises a third transistor M3, a fourth transistor M4 and a second capacitor C2. The third transistor M3 has a first terminal electrically connected to the second data line Ldata (2), a second terminal and a control terminal electrically connected to the scan line Lscan(1). The fourth transistor M4 has a first terminal electrically connected to the supply voltage VDD, a second terminal electrically connected to the third LED D[1,2] and the fourth LED D[2,2] via the third switch 12[1,2] and the fourth switch 12[2,2] respectively, and a control terminal electrically connected to the second terminal of the third transistor M3. The second capacitor C2 is coupled to the first terminal of the fourth transistor M4 and the control terminal of the fourth transistor M4. It should be noted that the first transistor M1, the second transistor M2, the third transistor M3 and the fourth transistor M4 can be P-type transistors, but this disclosure is not limited thereto, in some embodiment, the first transistor M1, the second transistor M2, the third transistor M3 and the fourth transistor M4 may be N-type transistors.

In the first pixel circuit 10[1,1], the first transistor M1 serves as a switch controlled by the scan signal SCAN(1), the first capacitor C1 serves as data storage to hold pixel data of a data signal DATA(1), and the second transistor M2 serves as a data driver to drive the pixel data to one of the first LED D[1,1] and the second LED D[2,1]. Likewise, in the second pixel circuit 10[1,2], the third transistor M3 serves as a switch controlled by the scan signal SCAN(1), the second capacitor C1 serves as data storage to hold pixel data of a data signal DATA(2), and the fourth transistor M4 serves as a data driver to drive the pixel data to one of the third LED D[1,2] and the fourth LED D[2,2].

The pixel circuits are not limited to the use in the light-emitting device 1, and the pixel circuits can be adopted for use in the light-emitting devices 2 and 3.

The light-emitting devices 1, 2 and 3 utilize pixel interlacing driving method with shared pixel circuits, the circuit area and the manufacturing costs can be reduced, and the display resolution can be increased.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:
1. A light-emitting device configured to emit light in a frame which is split into a first field and a second field, the light-emitting device comprising:
   a scan line extending in a row direction;
   a first data line extending in a column direction;
   a second data line extending in the column direction;
   a first pixel circuit electrically connected to the scan line and the first data line;
   a second pixel circuit electrically connected to the scan line and the second data line;

a first light-emitting diode (LED) and a second LED, configured to be driven by the first pixel circuit; and
a third LED and a fourth LED, configured to be driven by the second pixel circuit;
wherein the first LED and the fourth LED are arranged in different rows and driven by the first pixel circuit and the second pixel circuit respectively in the first field, and the second LED and the third LED are arranged in different rows and driven by the first pixel circuit and the second pixel circuit respectively in the second field.

2. The light-emitting device of claim 1, further comprising a first switch coupled between the first LED and the first pixel circuit and a fourth switch coupled between the fourth LED and the second pixel circuit.

3. The light-emitting device of claim 2, further comprising a first emission control line configured to control the first switch and the fourth switch.

4. The light-emitting device of claim 3, wherein the first emission control line carries a first emission control signal to turn on the first switch and the fourth switch in the first field.

5. The light-emitting device of claim 4, wherein the first emission control signal has a first duty cycle generated according to desired brightness of the first LED and the fourth LED.

6. The light-emitting device of claim 2, further comprising a second switch coupled between the second LED and the first pixel circuit and a third switch coupled between the third LED and the second pixel circuit.

7. The light-emitting device of claim 6, wherein the first switch, the second switch, the third switch and the fourth switch are P-type transistors or N-type transistors.

8. The light-emitting device of claim 6, further comprising a second emission control line configured to control the second switch and the third switch.

9. The light-emitting device of claim 8, wherein the second emission control line carries a second emission control signal to turn on the second switch and the third switch in the second field.

10. The light-emitting device of claim 9, wherein the second emission control signal has a second duty cycle generated according to desired brightness of the second LED and the third LED.

11. The light-emitting device of claim 6, further comprising an emission control line configured to control the first switch, the second switch, the third switch, and the fourth switch.

12. The light-emitting device of claim 11, wherein a type of transistors used in two ones of the first switch, the second switch, the third switch, and the fourth switch is different from a type of transistors used in other two ones of the first switch, the second switch, the third switch, and the fourth switch.

13. The light-emitting device of claim 12, wherein the first switch and the fourth switch include P-type transistors, and the second switch and the third switch include N-type transistors.

14. The light-emitting device of claim 12, wherein the first switch and the third switch include P-type transistors, and the second switch and the fourth switch include N-type transistors.

15. The light-emitting device of claim 1, wherein at least one of the first LED, the second LED, the third LED, and the fourth LED is an inorganic light-emitting diode or a micro LED.

16. The light-emitting device of claim 1, wherein at least one of the first LED, the second LED, the third LED, and the fourth LED is an organic light-emitting diode.

17. The light-emitting device of claim 1, wherein at least one of the first LED, the second LED, the third LED, and the fourth LED can emit lights of multiple colors.

18. The light-emitting device of claim 1, wherein at least one of the first LED, the second LED, the third LED, and the fourth LED can emit blue light.

19. The light-emitting device of claim 1, wherein:
the first pixel circuit comprises:
a first transistor having a first terminal electrically connected to the first data line, a second terminal and a control terminal electrically connected to the scan line;
a second transistor having a first terminal electrically connected to a supply voltage, a second terminal electrically connected to the first LED and the second LED, and a control terminal electrically connected to the second terminal of the first transistor; and
a first capacitor, coupled to the first terminal of the second transistor and the control terminal of the second transistor.

20. The light-emitting device of claim 19, wherein the first transistor, the second transistor are P-type transistors or N-type transistors.

* * * * *